United States Patent
Han et al.

(10) Patent No.: US 9,632,376 B2
(45) Date of Patent: Apr. 25, 2017

(54) LIQUID CRYSTAL DISPLAY DEVICE INCLUDING SWITCHING ELEMENT WITH FLOATING TERMINAL

(71) Applicant: Samsung Display Co., Ltd., Yongin-si, Gyeonggi-do (KR)

(72) Inventors: Min-Joo Han, Seoul (KR); Dan Bi Yang, Gunpo-si (KR); Ji Phyo Hong, Pyeongtaek-si (KR); Ki Chul Shin, Seongnam-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 15 days.

(21) Appl. No.: 14/878,058

(22) Filed: Oct. 8, 2015

(65) Prior Publication Data

US 2016/0291383 A1 Oct. 6, 2016

(30) Foreign Application Priority Data

Mar. 31, 2015 (KR) .................. 10-2015-0045220

(51) Int. Cl.
*G02F 1/1362* (2006.01)
*H01L 27/12* (2006.01)
(Continued)

(52) U.S. Cl.
CPC ........ *G02F 1/13624* (2013.01); *G02F 1/1368* (2013.01); *G02F 1/136209* (2013.01);
(Continued)

(58) Field of Classification Search
CPC .. G09G 3/3233; G09G 3/3648; G09G 3/3659; G09G 3/3688; G09G 3/2074; G09G 3/3677; G09G 3/36; G09G 3/3696; G09G 2320/028; G09G 2300/0809; G09G 2300/0447; H01L 27/1214; H01L 27/1251; H01L 27/3248; H01L 27/3244;
(Continued)

(56) References Cited

U.S. PATENT DOCUMENTS 8,274,620 B2      9/2012  Chiu et al.
2012/0086685 A1*  4/2012  Lee ..................... G02F 1/13624
                                                         345/208

FOREIGN PATENT DOCUMENTS

KR  1020110117998 A  10/2011
KR  1020110137015 A  12/2011
KR  1020140097905 A   8/2014

* cited by examiner

*Primary Examiner* — Thoi Duong
(74) *Attorney, Agent, or Firm* — Cantor Colburn LLP (57) ABSTRACT

A liquid crystal display device includes: a first substrate for which a single pixel includes: first, second and third thin film transistors on the first substrate; a pixel electrode including a first subpixel electrode and a second subpixel electrode which are connected to the first thin film transistor and the second thin film transistor, respectively; and a divided reference voltage line connected to the third thin film transistor; a second substrate facing the first substrate; a common electrode on the second substrate; and a liquid crystal layer between the pixel electrode and the common electrode and including liquid crystal molecules. The third thin film transistor includes an electrically floating gate electrode, a source electrode defined by an extended portion of a terminal of the second thin film transistor, and a drain electrode defined by an extended portion of the divided reference voltage line.

14 Claims, 6 Drawing Sheets

(51) Int. Cl.
*H01L 29/423* (2006.01)
*H01L 29/788* (2006.01)
*G02F 1/1368* (2006.01)

(52) U.S. Cl.
CPC .. *G02F 1/136213* (2013.01); *G02F 1/136286* (2013.01); *H01L 27/124* (2013.01); *H01L 29/42324* (2013.01); *H01L 29/788* (2013.01)

(58) Field of Classification Search
CPC ............ H01L 27/3262; H01L 27/3272; H01L 27/3276; H01L 29/4908; H01L 29/42324; H01L 29/78609; H01L 29/788; G02F 1/1368; G02F 1/13624; G02F 1/136286; G02F 1/134309; G02F 1/13306; G02F 1/133753; G02F 1/1362; G02F 1/136; G02F 1/1337; G02F 1/1343; G02F 1/134336; G02F 2001/134345; G02F 2001/134354
USPC ...... 257/59, 72, E29.273, E29.117, E29.137, 257/E29.151; 349/48, 41, 139, 42, 144, 349/33, 43, 129, 141; 345/87, 92, 204; 438/158, 128, 151, 30
See application file for complete search history.

LIQUID CRYSTAL DISPLAY DEVICE INCLUDING SWITCHING ELEMENT WITH FLOATING TERMINAL

This application claims priority to Korean Patent Application No. 10-2015-0045220 filed on Mar. 31, 2015, and all the benefits accruing therefrom under 35 U.S.C. §119, the entire contents of which are incorporated herein by reference.

BACKGROUND (a) Field

The invention relates to a liquid crystal display device.

(b) Description of the Related Art

A liquid crystal display device which is one of the most common types of flat panel displays in use, includes two display panels with field generating electrodes therein such as a pixel electrode and a common electrode, and a liquid crystal layer interposed between the two display panels. The liquid crystal display device generates an electric field in the liquid crystal layer by applying voltage to the field generating electrodes, and determines the direction of liquid crystal molecules of the liquid crystal layer by the generated electric field, thus controlling polarization of incident light so as to display an image.

Among liquid crystal display devices, a vertically aligned mode liquid crystal display device, in which long axes of liquid crystal molecules are aligned to be vertical to the display panels without applying the electric field, has a relatively large contrast ratio and easily implements a relatively wide reference viewing angle and thus has been in the limelight.

In such a vertically aligned mode liquid crystal display device, in order to implement the relatively wide viewing angle, a plurality of domains having different alignment directions of the liquid crystal may be formed in one pixel. As an example for forming the plurality of domains, a cutout such as a slit may be defined in the field generating electrode, and the like. Since multiple cutouts determine a tilt direction of the liquid crystal molecules, inclined directions of the liquid crystal molecules are aligned in various directions by disposing the cutouts in a particular arrangement, and thus the reference viewing angle may be widened.

In the vertically aligned mode liquid crystal display device, side visibility thereof may deteriorate as compared with front visibility thereof To reduce or effectively prevent deterioration of side visibility, a method of dividing one pixel of the vertically aligned mode liquid crystal display device into two subpixels and varying voltages of two subpixels is proposed.

SUMMARY

One or more exemplary embodiment of the invention provides a liquid crystal display device having advantages of improved aperture ratio and side visibility thereof.

An exemplary embodiment of the invention provides a liquid crystal display device including: a first substrate for which a single pixel includes: a first thin film transistor, a second thin film transistor and a third thin film transistor on the first substrate; a pixel electrode including a first subpixel electrode and a second subpixel electrode which are connected to the first thin film transistor and the second thin film transistor, respectively; and a divided reference voltage line connected to the third thin film transistor; a second substrate facing the first substrate; a common electrode on the second substrate; and a liquid crystal layer between the pixel electrode and the common electrode and including liquid crystal molecules. The third thin film transistor includes: an electrically floating gate electrode, a source electrode defined by an extended portion of a terminal of the second thin film transistor, and a drain electrode defined by an extended of the divided reference voltage line.

The electrically floating gate electrode and the drain electrode defined by the extended portion of the divided reference voltage line may form a first capacitor, and the electrically floating gate electrode and the source electrode defined by the extended portion of the terminal of the second thin film transistor may form a second capacitor.

The liquid crystal display device may further include a gate line and a data line on the first substrate and insulatively crossing each other. The first thin film transistor and the second thin film transistor may be connected with the gate line and the data line on the first substrate and insulatively crossing each other.

The electrically floating gate electrode may be in a same layer as the gate line. The electrically floating gate electrode in the same layer as the gate line may be separated from the gate line.

The data line and the divided reference voltage line may be in a same layer as each other.

The data line may apply a same voltage to the first thin film transistor and to the second thin film transistor, the voltage applied to the second thin film transistor may be divided through the third thin film transistor including the electrically floating gate electrode to define a divided reference voltage less than the voltage applied to the second thin film transistor, and the drain electrode defined by the extended portion of the divided reference voltage line may receive the divided reference voltage which is less than the voltage applied to the second thin film transistor.

The single pixel may further include a first liquid crystal capacitor defined therein. The first thin film transistor may include a first gate electrode defined by a first extended portion of the gate line, a first source electrode defined by a first extended portion of the data line, and a first drain electrode in a same layer as the first source electrode, the first drain electrode separated from the first source electrode. The first thin film transistor may be connected to the first liquid crystal capacitor.

The single pixel may further include a second liquid crystal capacitor defined therein. The second thin film transistor may include a second gate electrode defined by a second extended portion of the gate line of which the first extended portion thereof defines the first gate electrode, a second source electrode defined by a second extended portion of the data line of which the first extended portion thereof defines the first source electrode, and a second drain electrode in a same layer as the second source electrode, the second drain electrode separated from the second source electrode. The second thin film transistor may be connected to the second liquid crystal capacitor.

Each of the first subpixel electrode and the second subpixel electrode may include a cross stem, and a plurality of minute branches extended in an oblique direction from the cross stem.

The first drain electrode of the first thin film transistor may overlap the cross stem of the first subpixel electrode.

The first subpixel electrode and the first thin film transistor may be connected to each other at a cross point of the cross stem.

The liquid crystal display device may further include a light blocking member on the second substrate. The light blocking member may overlap the first to third thin film transistors to have a length in an extending direction of the gate line and a width in a direction perpendicular to the length thereof.

The width of the light blocking member may be approximately 40 micrometers (μm) to approximately 70 μm.

According to one or more exemplary embodiment of the invention, an aperture ratio of the liquid crystal display device is improved by reducing an area of a region where a thin film transistor is positioned and side visibility of the liquid crystal display device is improved through first and second subpixels thereof receiving different voltages.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of a liquid crystal display device according to the invention will be described with reference to FIGS. 1 and 2.

Figure 1:
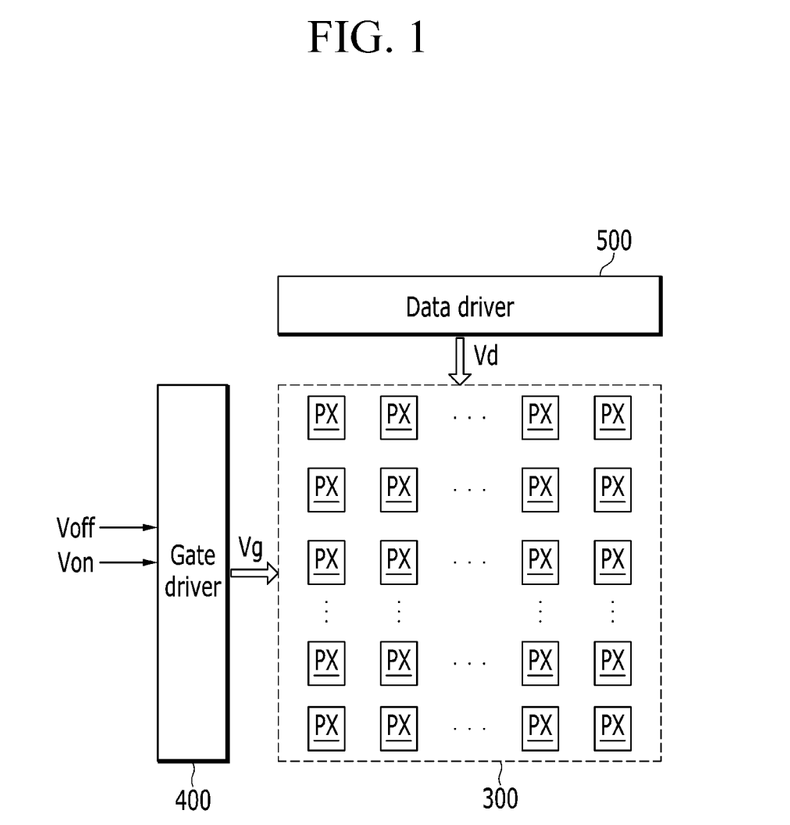
FIG. 1 is a block diagram illustrating an exemplary embodiment of a liquid crystal display device according to the invention.
Figure 2:
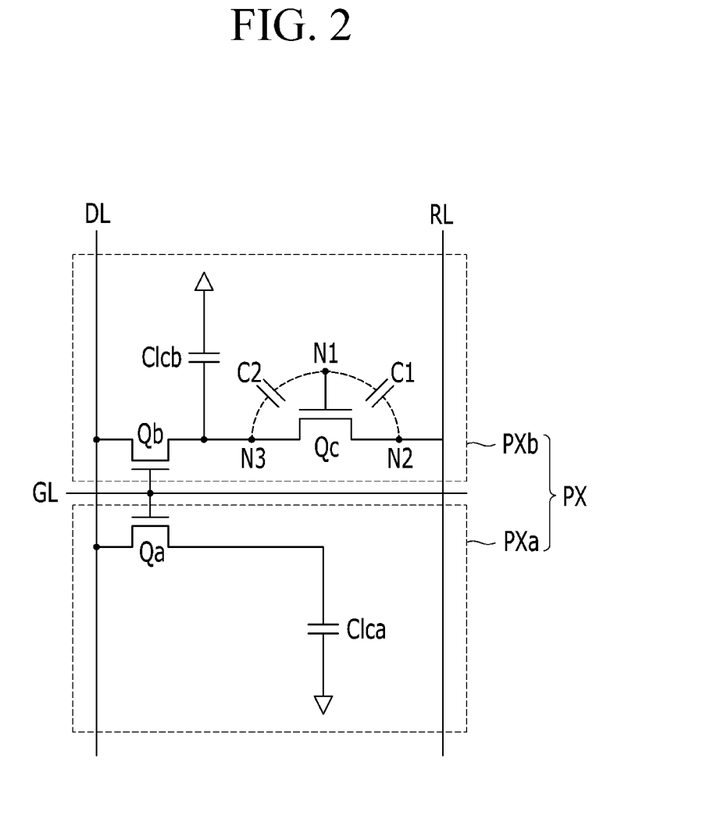
FIG. 2 is an equivalent circuit diagram of an exemplary embodiment of a single pixel in a liquid crystal display device according to the invention.

FIG. 1 is a block diagram illustrating an exemplary embodiment of a liquid crystal display device according to the invention, and FIG. 2 is an equivalent circuit diagram of an exemplary embodiment of a single pixel in a liquid crystal display device according to the invention.

Referring to FIG. 1, a liquid crystal display device includes a liquid crystal panel assembly 300, a gate driver 400 connected to the liquid crystal panel assembly 300, and a data driver 500 connected to the liquid crystal panel assembly 300.

Referring to FIGS. 1 and 2, the liquid crystal panel assembly 300 includes a plurality of signal lines GL, DL and RL, and a plurality of pixels PX connected to the signal lines when viewed from an equivalent circuit. The plurality of pixels PX when viewed from an equivalent circuit is arranged substantially in a matrix form.

The exemplary embodiment of a single one pixel PX of the display device includes a first subpixel PXa and a second subpixel PXb, a plurality of signal lines among the signal lines GL, DL and RL to include a gate line GL which transfers a gate signal, a data line DL which transfers a data signal, and a divided reference voltage line RL which transfers a divided reference voltage, first, second and third thin film transistors Qa, Qb and Qc connected to the plurality of signal lines among the signal lines GL, DL and RL, and first and second liquid crystal capacitors Clca and Clcb.

The first and second thin film transistors Qa and Qb are connected to the gate line GL and the data line DL, respectively, and the third thin film transistor Qc is connected to an output terminal of the second thin film transistor Qb and the divided reference voltage line RL. Referring to FIG. 2, the first and second thin film transistors Qa and Qb are connected to the same single gate line GL and the same single data line DL, respectively.

The first thin film transistor Qa and the second thin film transistor Qb are three-terminal elements such as a thin film transistor. Control terminals of the first thin film transistor Qa and the second thin film transistor Qb are connected to the gate line GL, input terminals thereof are connected to the data line DL, an output terminal of the first thin film transistor Qa is connected to the first liquid crystal capacitor Clca, and an output terminal of the second thin film transistor Qb is connected to both the second liquid crystal capacitor Clcb and to the input terminal of the third thin film transistor Qc.

In the first liquid crystal capacitor Clca and the second liquid crystal capacitor Clcb, two electrodes, for example, a subpixel electrode (not illustrated) of a lower display panel (not illustrated) and a common electrode (not illustrated) of an upper display panel (not illustrated) serve as two terminals, respectively, and a liquid crystal layer (not illustrated) between two electrodes serve as a dielectric material.

The third thin film transistor Qc is also a three-terminal element. A control terminal N1 of the third thin film transistor Qc is electrically floating, an input terminal N3 is connected to the second thin film transistor Qb and the second liquid crystal capacitor Clcb, and an output terminal N2 is connected with the divided reference voltage line RL. As illustrated in FIG. 2, the control terminal N1 and the output terminal N2 of the third thin film transistor Qc form a first capacitor C1 together and the control terminal N1 and the input terminal N3 of the third thin film transistor Qc form a second capacitor C2 together.

When a gate-on signal is applied to the gate line GL, the first thin film transistor Qa and the second thin film transistor Qb which are each connected to the gate line GL are turned on. As a result, a data voltage from the data line DL is applied to the first subpixel PXa and the second subpixel PXb through the turned-on first thin film transistor Qa and second thin film transistor Qb.

The data voltages applied to the first subpixel PXa and the second subpixel PXb are the same as each other, and the first liquid crystal capacitor Clca and the second liquid crystal capacitor Clcb are charged with voltages of the same electrical value by a difference between a common voltage and the data voltage applied to the pixel PX.

Simultaneously, among the voltages of the same electrical value which charge the first liquid crystal capacitor Clca and the second liquid crystal capacitor Clcb, when the third thin film transistor Qc including the control terminal N1 electrically floating is turned on due to an effect of the gate-on signal, the same electrical value voltage initially charged in the second liquid crystal capacitor Clcb is divided through the third thin film transistor Qc including the control terminal N1 electrically floating. By dividing the initial same electrical value voltage which charges the second liquid crystal capacitor Clcb, a first voltage less than the initial same electrical value voltage defines a divided reference voltage and a second voltage of the initial same electrical value voltage excluding the first voltage remains to charge the second liquid crystal capacitor Clcb. As mentioned above, the divided reference voltage line RL which defines the drain electrode 175c of the third thin film transistor Qc transfers the divided reference voltage to output the divided reference voltage from the second subpixel PXb. As a result, a final voltage value charged in the second liquid crystal capacitor Clcb is decreased by a difference between the common voltage and the divided reference voltage. That is, the voltage charged in the first liquid crystal capacitor Clca is higher than the final voltage charged in the second liquid crystal capacitor Clcb.

As such, the voltage charged in the first liquid crystal capacitor Clca and the final voltage charged in the second liquid crystal capacitor Clcb are different from each other. Since the voltage of the first liquid crystal capacitor Clca and the final voltage of the second liquid crystal capacitor Clcb are different from each other, tilt angles of liquid crystal molecules in the first subpixel PXa and the second subpixel PXb are different from each other, and as a result, luminance of two subpixels PXa and PXb is different from each other. Accordingly, when the voltage of the first liquid crystal capacitor Clca and the final voltage of the second liquid crystal capacitor Clcb are appropriately controlled, an image viewed from the side of the liquid crystal display device may be maximally approximated to an image viewed from the front of the liquid crystal display device, thereby improving side visibility thereof.

Further, according to the exemplary embodiment of the invention, the third thin film transistor Qc of which a portion thereof is defined by the divided reference voltage line RL so as to allow a relatively low final voltage to be charged in the second liquid crystal capacitor Clcb may serve as a switching element through the control terminal N1 which is not connected to the gate line GL but is instead electrically floated.

In the illustrated exemplary embodiment, in order to vary the voltage charged in the first liquid crystal capacitor Clca and the final voltage charged in the second liquid crystal capacitor Clcb, the third thin film transistor Qc connected to the second liquid crystal capacitor Clcb and the divided reference voltage line RL is included, but the invention is not limited thereto. In another exemplary embodiment of the invention, the second liquid crystal capacitor Clcb may be connected to a step-down capacitor. In detail, the third thin film transistor including a first terminal connected to a step-down gate line, a second terminal connected to the second liquid crystal capacitor Clcb, and a third terminal connected to the step-down capacitor is included. As a result, charged voltages between the first liquid crystal capacitor Clca and the second liquid crystal capacitor Clcb may be differently set by charging a portion of the amount charged in the second liquid crystal capacitor Clcb in the step-down capacitor.

In addition, a storage capacitor (not illustrated) which plays an auxiliary role of the first and second liquid crystal capacitors Clca and Clcb, may be further included.

In order to implement color display, each pixel PX uniquely displays one of the primary colors (spatial division) or alternately displays the primary colors with time (temporal division) so that a desired color image is recognized by the spatial and temporal sum of the primary colors. An example of the primary colors may include three primary colors of red, green and blue. As an example of the spatial division, each pixel PX may include a color filter (not illustrated) representing one of the primary colors.

At least one polarizer (not illustrated) may be provided in the liquid crystal panel assembly 300.

Referring back to FIGS. 1 and 2, the data driver 500 is connected with the data line DL of the liquid crystal panel assembly 300 and applies a data voltage Vd to the data line DL.

The gate driver 400 is connected with the gate line GL of the liquid crystal panel assembly 300 and applies, to the gate line GL, a gate signal Vg. The gate signal VG may include a combination of a gate-on voltage Von which turns on the first and second thin film transistors Qa and Qb and a gate-off voltage Voff which turns off the first and second thin film transistors Qa and Qb.

Hereinafter, the single one pixel of the liquid crystal display device illustrated in FIGS. 1 and 2 will be described in detail with reference to FIGS. 3 to 5.

Figure 3:
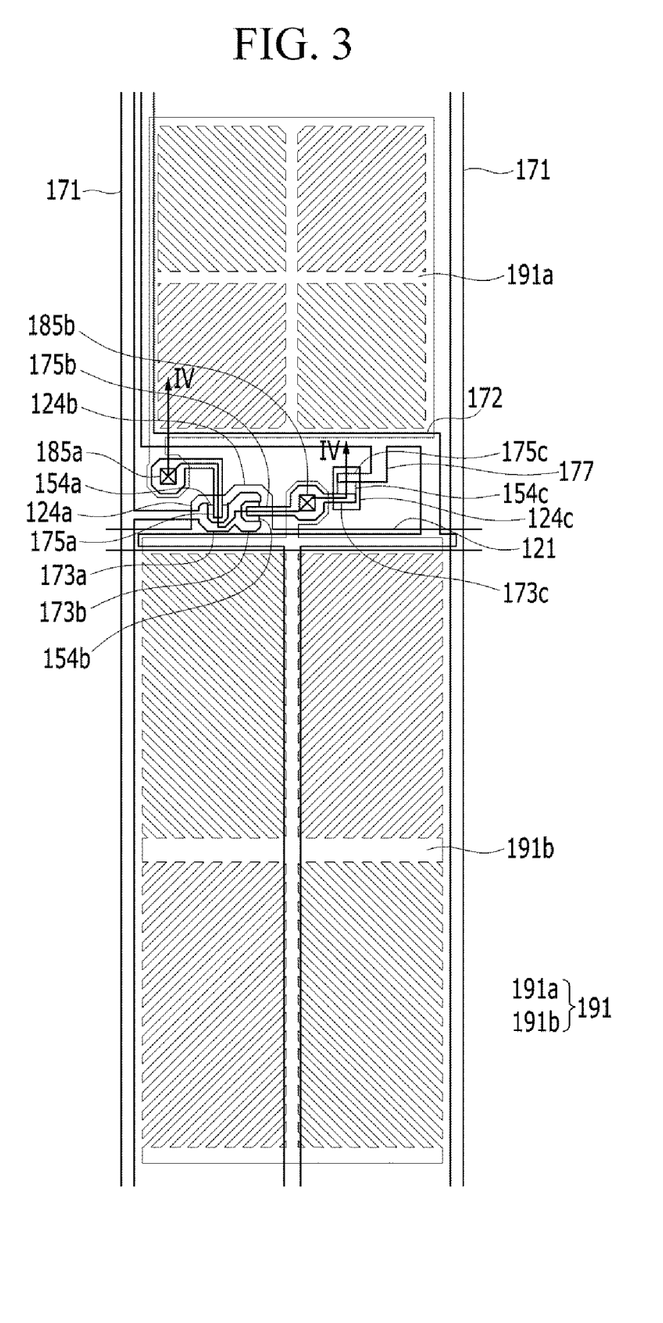
FIG. 3 is a top plan view of an exemplary embodiment of the single pixel of the liquid crystal display device of FIG. 2 according to the invention.
Figure 4:
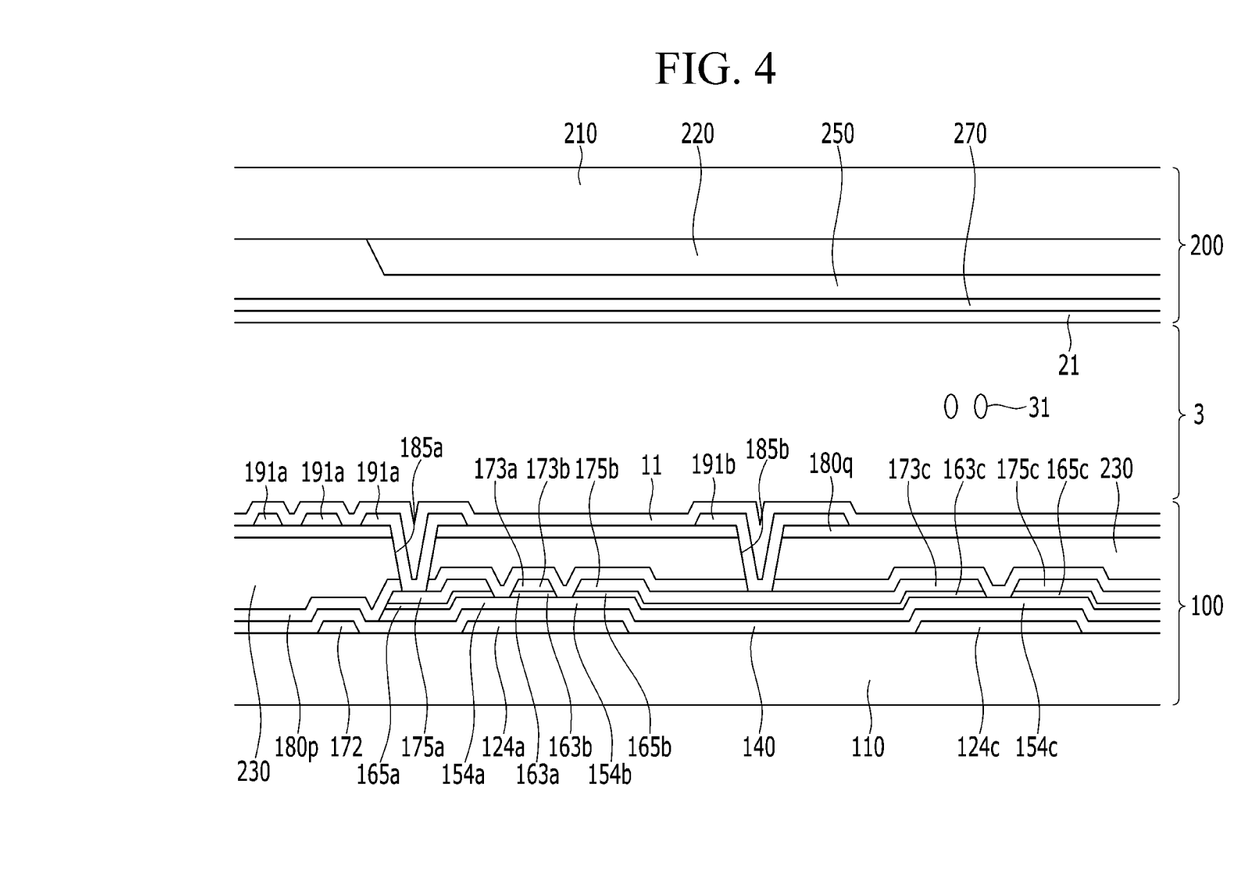
FIG. 4 is a cross-sectional view of FIG. 3 taken along line IV-IV.
Figure 5:
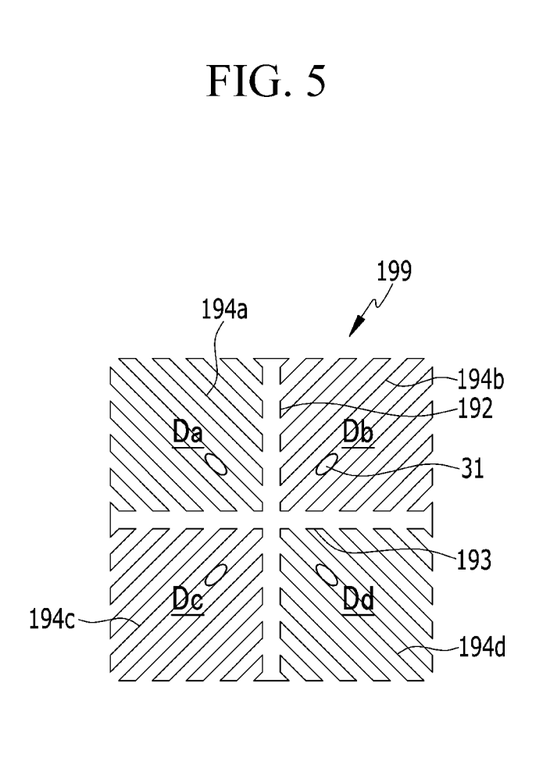
FIG. 5 is a top plan view of an exemplary embodiment of a basic pixel electrode according to the invention.

FIG. 3 is a top plan view of the single one pixel of the liquid crystal display device illustrated in FIGS. 1 and 2 according to the invention, FIG. 4 is a cross-sectional view of FIG. 3 taken along line IV-IV, and FIG. 5 is a plan view of an exemplary embodiment of a basic electrode according to the invention.

The liquid crystal display device according to the includes a lower display panel 100 and an upper display panel 200 facing each other, and a liquid crystal layer 3 interposed between the two display panels 100 and 200.

First, the lower display panel 100 will be described.

A plurality of gate conductors including a plurality of gate lines 121 and a floating gate electrode 124c which is a third gate electrode are positioned on a first substrate 110. The first substrate 110 may include or be formed of an insulating material. The gate conductors are disposed in a same layer of the lower display panel 100 among layers disposed on the first substrate 110.

The gate line 121 has a length which mainly extends in a horizontal direction in the top plan view and transfers a gate signal. The gate line 121 includes a first gate electrode 124a and a second gate electrode 124b that protrude upwards in a vertical direction in the top plan view from a main portion of the gate line 121. The first gate electrode 124a and the second gate electrode 124b are connected to each other to form a single, unitary gate conductor member.

The third gate electrode in the exemplary embodiment of the invention, that is, the floating gate electrode 124c is electrically floating and has a discrete island shape. As used herein, for example, the third gate electrode 124c is not electrically connected to another conductive element to be considered as electrically floating.

A gate insulating layer 140 is positioned on the gate conductor.

A layer of a plurality of semiconductor stripes (not illustrated) which may include or be formed of amorphous silicon, crystalline silicon, or the like is positioned on the gate insulating layer 140. The semiconductor stripes may have lengths that mainly extend in the vertical direction in the top plan view. The semiconductor stripes include first and second semiconductor layers 154a and 154b which extend from the main length portion thereof toward the first and second gate electrodes 124a and 124b and are connected with each other, and a third semiconductor layer 154c protruding from the second semiconductor layer 154b and positioned on the third gate electrode 124c.

On the first semiconductor layer 154a, a pair of ohmic contacts 163a and 165a is positioned, and on the second semiconductor layer 154b, a pair of ohmic contacts 163b and 165b is positioned. Further, on the third semiconductor layer 154c, a pair of ohmic contacts 163c and 165c is positioned. The ohmic contact 163a may be connected with an ohmic contact stripe (not illustrated) positioned on the semiconductor stripe, the ohmic contacts 165a and 163b may be connected to each other, and the ohmic contacts 165b and 163c may be connected to each other. The ohmic contacts 163a, 165a, 163b, 165b, 163c and 165c may include or be formed of n+ hydrogenated amorphous silicon in which an n-type impurity such as phosphorous is doped at a relatively high concentration, or may include or be formed of silicide.

Where the first, second and third semiconductor layers 154a, 154b and 154c are oxide semiconductors, the ohmic contacts may be omitted.

A plurality of data conductors including a data line 171 which includes a first source electrode 173a and a second source electrode 173b, a divided reference voltage line 172 which includes a third source electrode 173c, and first, second and third drain electrodes 175a, 175b and 175c are respectively positioned on the ohmic contacts 163a, 165a, 163b, 165b, 163c and 165c and on the gate insulating layer 140. The data conductors are disposed in a same layer of the lower display panel 100 among layers disposed on the first substrate 110.

In an exemplary embodiment of manufacturing the liquid crystal display device, the data conductors, the ohmic contacts, and the semiconductor layers positioned below the ohmic contacts may be simultaneously formed by using one mask.

The data line 171 has a length which mainly extends in a row (e.g., vertical) direction in the top plan view along an edge of the pixel PX. The first source electrode 173a and the second source electrode 173b protrude from a main portion of the data line 171. The first source electrode 173a and the second source electrode 173b may each have a 'U' shape in the top plan view, but are not limited thereto.

The first drain electrode 175a faces the first source electrode 173a, and for example, has an "I" shape corresponding to the first source electrode 173a having the 'U' shape. The first drain electrode 175a includes a relatively wide first end at which is connected a first subpixel electrode 191a, and a bar-shaped second end opposite to the first end.

The second drain electrode 175b faces the second source electrode 173b, and for example, has an 'I' shape corresponding to the second source electrode 173*b* having the 'U' shape. The second drain electrode 175*b* includes a relatively wide first end at which is connected a second subpixel electrode 191*b*, and a bar-shaped second end opposite to the first end.

The third source electrode 173*c* is defined by an extended portion of the second drain electrode 175*b*. The third source electrode 173*c* and the second drain electrode 175*b* may form a single, unitary data conductor member.

Further, the data conductor includes the divided reference voltage line 172, and a portion of the divided reference voltage line 172 defines the third drain electrode 175*c* of the third thin film transistor Qc.

The divided reference voltage line 172 includes a plurality of horizontal portions and a vertical portion which connects the horizontal portions to each other. That is, the horizontal portions and the vertical portion which connects the horizontal portions to each other may be arranged in various ways such that the divided reference voltage line 172 may have any of a number of shapes in the top plan view.

Among portions of the divided reference voltage line 172 positioned in the first subpixel PXa, an extension of a horizontal portion 177 positioned at the bottom of the first subpixel PXa protrudes downward to define the third drain electrode 175*c*.

The aforementioned first gate electrode 124*a*, first source electrode 173*a* and first drain electrode 175*a* form a first thin film transistor ("TFT") Qa together with the first semiconductor layer 154*a*, and a channel of the first TFT Qa is formed at a portion of the first semiconductor layer 154*a* exposed between the first source electrode 173*a* and the first drain electrode 175*a*. Similarly, the second gate electrode 124*b*, the second source electrode 173*b* and the second drain electrode 175*b* form a second TFT Qb together with the second semiconductor layer 154*b*, and a channel of the second TFT Qb is formed at a portion of the second semiconductor layer 154*b* exposed between the second source electrode 173*b* and the second drain electrode 175*b*. The third gate electrode 124*c*, the third source electrode 173*c* and the third drain electrode 175*c* form a TFT Qc together with the third semiconductor layer 154*c*, and a channel of the third TFT Qc is formed at a portion of the third semiconductor layer 154*c* exposed between the third source electrode 173*c* and the third drain electrode 175*c*.

A first passivation layer 180*p* is positioned on the data conductors and on the exposed portions of the semiconductor layers 154*a*, 154*b* and 154*c*.

The first passivation layer 180*p* may include an inorganic insulating material such as silicon nitride or silicon oxide. When a color filter is positioned on the first passivation layer 180*p*, flowing of a pigment of the color filter 230 into the exposed portions of the semiconductor layers 154*a*, 154*b* and 154*c* is reduced or effectively prevented.

A color filter 230 is positioned on the first passivation layer 180*p*. The color filer 230 may uniquely display one of the primary colors, and an example of the primary colors may include three primary colors of red, green and blue or yellow, cyan and magenta, and the like. Although not illustrated, the color filter 230 may further include a portion at which a mixed color of the primary colors or white in addition to the primary colors is displayed.

A second passivation layer 180*q* is positioned on the color filter 230, and may include or be formed of the same material as the first passivation layer 180*p*. In an exemplary embodiment, the second passivation layer 180*q* may be omitted.

In the first passivation layer 180*p*, the color filter 230 and the second passivation layer 180*q*, a first contact hole 185*a* and a second contact hole 185*b* exposing the first drain electrode 175*a* and the second drain electrode 175*b* are defined.

A pixel electrode 191 is positioned on the second passivation layer 180*q*. The pixel electrode 191 includes the first subpixel electrode 191*a* and the second subpixel electrode 191*b* which are separated from each other with the gate line 121 therebetween to be adjacent to each other in a column (e.g., vertical) direction.

The pixel electrode 191 may include or be formed of a transparent material such as indium tin oxide ("ITO") and indium zinc oxide ("IZO"). In addition to or alternative to the pixel electrode 191 including a transparent conductive material, the pixel electrode 191 may include or be formed of a reflective metal such as aluminum, silver, chromium, or an alloy thereof.

The first subpixel electrode 191*a* and the second subpixel electrode 191*b* may each include a basic electrode 199 illustrated in FIG. 5 or one or more modifications thereof.

As illustrated in FIG. 5, an overall shape of the basic electrode 199 has a quadrangular shape. The basic electrode 199 includes a cross stem portion configured by a horizontal stem 193 and a vertical stem 192 intersecting such as being perpendicular to the horizontal stem 193. Further, the basic electrode 199 is divided into a first domain Da, a second domain Db, a third domain Dc and a fourth domain Dd based on the horizontal stem 193 and the vertical stem 192. The respective domains Da-Dd include a plurality of first minute branches 194*a*, a plurality of second minute branches 194*b*, a plurality of third minute branches 194*c* and a plurality of fourth minute branches 194*d*.

The first minute branches 194*a* extend obliquely in an upper left direction from the horizontal stem 193 or the vertical stem 192, and the second minute branches 194*b* extend obliquely in an upper right direction from the horizontal stem 193 or the vertical stem 192. Further, the third minute branches 194*c* extend obliquely in a lower left direction from the horizontal stem 193 or the vertical stem 192, and the fourth minute branches 194*d* extend obliquely in a lower right direction from the horizontal stem 193 or the vertical stem 192. The minute branches have lengths obliquely extended as described above in an extension direction, and have widths taken perpendicular to the extension direction.

Sides extended along the length of the first to fourth minute branches 194*a*, 194*b*, 194*c* and 194*d* distort the electric field to make horizontal components thereof which determine tilt directions of liquid crystal molecules 31 of the liquid crystal layer 3. The horizontal components of the electric field are substantially parallel to the sides of the first to fourth minute branches 194*a*, 194*b*, 194*c* and 194*d*. Accordingly, as illustrated in FIG. 5, the liquid crystal molecules 31 are tilted in parallel directions to length (e.g., extension) directions of the minute branches 194*a*, 194*b*, 194*c* and 194*d*. Since one pixel electrode 191 having the overall shape of the basic electrode 199 includes four domains Da-Dd in which length directions of the minute branches 194*a*, 194*b*, 194*c* and 194*d* are different from each other, the tilt directions of the liquid crystal molecules 31 are approximately four, such that four domains in which alignment directions of the liquid crystal molecules 31 are different from each other are formed in the liquid crystal layer 3. As such, a reference viewing angle of the liquid crystal display device is increased by varying the tilt directions of the liquid crystal molecules 31.

Referring again to FIGS. 3 and 4, the first subpixel electrode 191*a* may receive a data voltage from first drain electrode 175a connected to the first subpixel electrode 191a at the first contact hole 185a. The second subpixel electrode 191b may receive a data voltage from the second drain electrode 175b connected to the second subpixel electrode 191b at the second contact hole 185b. For the first subpixel electrode 191a and the second subpixel electrode 191b, the data voltages received from the first and second thin film transistors Qa and Qb are the same as each other.

An alignment layer 11 may be positioned on the pixel electrode 191.

Next, the upper display panel 200 will be described.

A light blocking member 220 is positioned on a second substrate 210. The second substrate 210 may include or be formed of an insulating material. The light blocking member 220 blocks light from being transmitted between pixel electrodes 191 adjacent to each other to reduce or effectively prevent light leakage. An opening (not illustrated) may be defined in the light blocking member 220 to define an open region facing the pixel electrode 191.

In the exemplary embodiment, the color filter 230 is positioned in the lower display panel 100 and the light blocking member 220 is positioned in the upper display panel 200, but the invention is not limited thereto. In another exemplary embodiment, the color filter 230 and the light blocking member 220 may be independently positioned in any one of the lower display panel 100 and the upper display panel 200.

An overcoat 250 is disposed on the light blocking member 220, but the invention is not limited thereto. In an exemplary embodiment, the overcoat 250 may be omitted.

A common electrode 270 which faces the pixel electrode 191 and receives a common voltage Vcom is disposed on the overcoat 250. The common electrode 270 may be disposed as substantially a unitary plate so as to face a plurality of pixel electrodes 191, for example, all of the pixel electrodes 191, but the invention is not limited thereto.

An alignment layer 21 may be disposed on the common electrode 270.

Two alignment layers 11 and 21 of the lower display panel 100 and the upper display panel 200 may be vertical alignment layers, but the invention is not limited thereto.

The liquid crystal layer 3 interposed between the lower display panel 100 and the upper display panel 200 includes liquid crystal molecules 31 having dielectric anisotropy. The liquid crystal molecules 31 may be aligned so that long axes thereof are substantially vertical to the surfaces of the two display panels 100 and 200 in a state where an electric field is not applied.

The first subpixel electrode 191a of the lower display panel 100 forms the first liquid crystal capacitor Clca together with the common electrode 270 of the upper display panel 200, and with the liquid crystal layer 3 therebetween. The second subpixel electrode 191b forms the second liquid crystal capacitor Clcb together with the common electrode 270, and with the liquid crystal layer 3 therebetween.

The first and second subpixel electrodes 191a and 191b to which the data voltages are applied generate an electric field in the liquid crystal layer 3 together with the common electrode 270 of the upper display panel 200 so as to determine directions of the liquid crystal molecules 31 of the liquid crystal layer 3 between the two electrodes 191 and 270.

Further, a difference between the voltage of the first and second subpixel electrodes 191a and 191b, and the voltage of the common electrode 270, is represented as a charged voltage of the first and second liquid crystal capacitors Clca and Clcb, that is, the pixel voltage. In the liquid crystal molecules 31, an alignment or a tilt degree varies according to a magnitude of the pixel voltage, and as a result, a change degree of polarization of light incident to the liquid crystal layer 3 varies. The change of the polarization is represented as a transmittance change of the light by the polarizer, and as a result, the liquid crystal display device displays the image.

In the exemplary embodiment of the invention, the data voltage received in the second subpixel electrode 191b through the second thin film transistor Qb is changed by the third thin film transistor Qc. As a result, the charged voltage of the second liquid crystal capacitor Clcb and the first liquid crystal capacitor Clca, that is, the tilt degree of the liquid crystal molecules varies.

According to the exemplary embodiment of the invention, the third thin film transistor does not include the gate electrode extended from a main portion of the gate line, but instead includes a floating gate electrode which is separated and independent from the gate electrodes extended from the main portion of the gate line. Therefore, an area occupied by the switching element having the floating electrode as a terminal thereof without a separate signal line is reduced, and an area occupied by the pixel in which the third thin film transistor is disposed is increased, and thus the aperture ratio of the liquid crystal display device may be improved.

Figure 6:
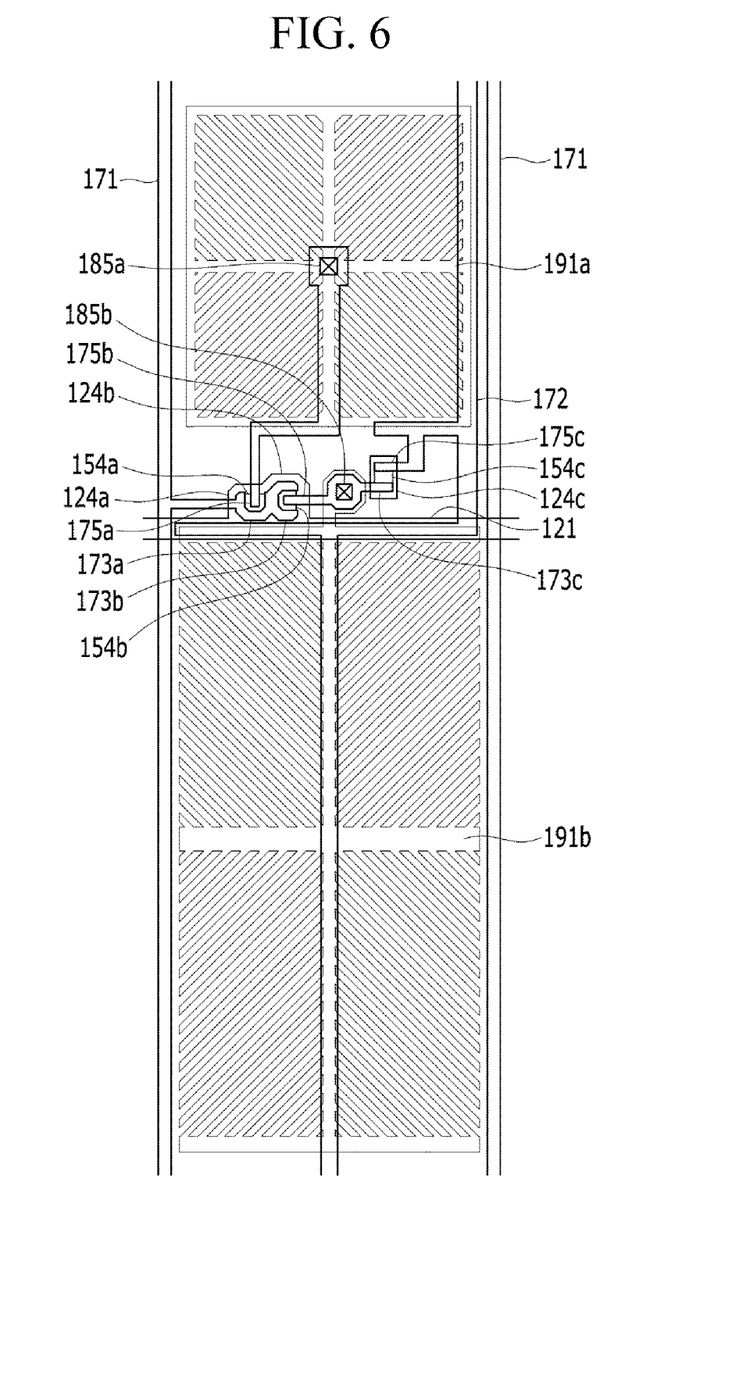
FIG. 6 is a top plan view of another exemplary embodiment of a single pixel of a liquid crystal display device according to the invention.

Hereinafter, another exemplary embodiment of a liquid crystal display device according to the invention will be described with reference to FIG. 6. FIG. 6 is a top plan view of another exemplary embodiment of a single one pixel of a liquid crystal display device according to the invention. Hereinafter, description of like and similar constituent elements to the exemplary embodiment of the invention will be omitted.

According to another exemplary embodiment of the invention, a plurality of data conductors includes a data line 171, a first source electrode 173a, a second source electrode 173b, a third source electrode 173c, a first drain electrode 175a, a second drain electrode 175b, a third drain electrode 175c and a divided reference voltage line 172.

The data line 171 has a length which is extended in a row (e.g., vertical) direction in the top plan view along an edge of the pixel PX. The first source electrode 173a and the second source electrode 173b protrude from a main portion of the data line 171. The first source electrode 173a and the second source electrode 173b may each have a 'U' shape in the top plan view, but are not limited thereto.

The first drain electrode 175a faces the first source electrode 173a, and for example, has an 'I' shape corresponding to the first source electrode 173a having the 'U' shape. The first drain electrode 175a includes a relatively wide first end at which is connected the first subpixel electrode 191a.

Particularly, as illustrated in FIG. 6, the first drain electrode 175a may be disposed to overlap with the first subpixel electrode 191a. The first drain electrode 175a may be extended to overlap with a cross stem portion of the first subpixel electrode 191a as well as an outer portion thereof connecting the minute branches to each other.

The second drain electrode 175b faces the second source electrode 173b, and for example, has an 'I' shape corresponding to the second source electrode 173b having the 'U' shape. The second drain electrode 175b includes a relatively wide first end at which is connected the second subpixel electrode 191b, and a bar-shaped second end opposite to the first end.

The third source electrode 173c is defined by an extended portion of the second drain electrode 175b. The third source electrode 173c and the second drain electrode 175b may form a single, unitary data conductor member.

Further, the data conductor includes the divided reference voltage line 172, and a portion of the divided reference voltage line 172 defines the third drain electrode 175c of the third thin film transistor Qc.

The divided reference voltage line 172 includes a plurality of horizontal portions and a vertical portion which connects the horizontal portions to each other. That is, the horizontal portions and the vertical portion which connects the horizontal portions to each other may be arranged in various ways such that the divided reference voltage line 172 may have any of a number of shapes.

Among portions of the divided reference voltage line 172 positioned in the first subpixel PXa, an extension of a horizontal portion positioned at the bottom of the first subpixel PXa protrudes downward to define the third drain electrode 175c.

The aforementioned first gate electrode 124a, first source electrode 173a and first drain electrode 175a form a first TFT Qa together with the first semiconductor layer 154a, and a channel of the first TFT Qa is formed at a portion of the first semiconductor layer 154a exposed between the first source electrode 173a and the first drain electrode 175a. Similarly, the second gate electrode 124b, the second source electrode 173b and the second drain electrode 175b form a second TFT Qb together with the second semiconductor layer 154b, and a channel of the second TFT Qb is formed at a portion of the second semiconductor layer 154b exposed between the second source electrode 173b and the second drain electrode 175b. The third gate electrode 124c, the third source electrode 173c and the third drain electrode 175c form a third TFT Qc together with the third semiconductor layer 154c, and a channel of the third TFT Qc is formed at a portion of the third semiconductor layer 154c exposed between the third source electrode 173c and the third drain electrode 175c.

A first passivation layer 180p is positioned on the data conductors and on the exposed portions of the semiconductor layers 154a, 154b and 154c.

A color filter 230 is positioned on the first passivation layer 180p. The color filer 230 may uniquely display one of the primary colors, and an example of the primary colors may include three primary colors of red, green and blue or yellow, cyan and magenta, and the like. Although not illustrated, the color filter 230 may further include a portion thereof at which is displayed a mixed color of the primary colors or white in addition to the primary colors.

A second passivation layer 180q is positioned on the color filter 230, and may include or be formed of the same material as the first passivation layer 180p. In an exemplary embodiment, the second passivation layer 180q may be omitted.

In the first passivation layer 180p, the color filter 230, and the second passivation layer 180q, a first contact hole 185a and a second contact hole 185b exposing the first drain electrode 175a and the second drain electrode 175b are defined.

In the illustrated exemplary embodiment of the invention, the first contact hole 185a may be positioned at a cross point of a cross stem portion of the first subpixel electrode 191a. With the first contact hole 185a positioned at a cross point of the cross stem portion of the first subpixel electrode 191a, deterioration of an aperture ratio due to an area occupied by the first contact hole 185a may be reduced or effectively prevented.

A pixel electrode 191 is positioned on the second passivation layer 180q. The pixel electrode 191 includes the first subpixel electrode 191a and the second subpixel electrode 191b which are separated from each other with the gate line 121 therebetween to be adjacent to each other in a column (e.g., vertical) direction.

Each of the first subpixel electrode 191a and the second subpixel electrode 191b includes a basic electrode 199 illustrated in FIG. 5 or one or more modifications thereof as described above.

As illustrated in FIG. 5, an overall shape of the basic electrode 199 has a quadrangular shape. The basic electrode 199 includes a cross stem portion configured by a horizontal stem 193 and a vertical stem 192 intersecting such as being perpendicular to the horizontal stem 193. Further, the basic electrode 199 is divided into a first domain Da, a second domain Db, a third domain Dc and a fourth domain Dd based on the horizontal stem 193 and the vertical stem 192. The respective domains Da-Dd include a plurality of first minute branches 194a, a plurality of second minute branches 194b, a plurality of third minute branches 194c and a plurality of fourth minute branches 194d.

The first subpixel electrode 191a may receive a data voltage from first drain electrode 175a connected to (e.g., contacting) the first subpixel electrode 191a at the first contact hole 185a positioned at the cross point of the cross stem portion of the first subpixel electrode 191a. The second subpixel electrode 191b may receive a data voltage from the second drain electrode 175b connected to the second subpixel electrode 191b at the second contact hole 185b. For the first subpixel electrode 191a and the second subpixel electrode 191b, the data voltages received from the first and second thin film transistors Qa and Qb are the same as each other.

Next, the upper display panel 200 will be described.

A light blocking member 220 is positioned on a second substrate 210. The second substrate 210 may include or be formed of an insulating material. The light blocking member 220 blocks light from being transmitted between pixel electrodes 191 adjacent to each other to reduce or effectively prevent light leakage. An opening (not illustrated) may be defined in the light blocking member 220 to define an open region facing the pixel electrode 191.

In the exemplary embodiment, the color filter 230 is positioned on the lower display panel 100 and the light blocking member 220 is positioned on the upper display panel 200, but the invention is not limited thereto. In another exemplary embodiment, the color filter 230 and the light blocking member 220 may be independently positioned in any one of the lower display panel 100 and the upper display panel 200.

Referring to FIGS. 4 and 6, for example, the light blocking member 220 is disposed at a TFT area disposed between the first and second subpixel electrodes 191a and 191b adjacent in the vertical direction. At the TFT area between the first and second subpixel electrodes 191a and 191b adjacent in the vertical direction, the light blocking member 220 has a length extended in the horizontal direction and a width in the vertical direction. A width of the light blocking member 200 according to the invention may be approximately 40 micrometers (μm) to approximately 70 μm. Since the first contact hole 185a at which the drain electrode of a TFT is exposed is positioned to overlap with the first subpixel electrode 191a, an overall area occupied by the TFT and the contact hole is reduced such that a width of the light blocking member overlapping with the areas may also be reduced. Accordingly, in one or more exemplary embodiment of the liquid crystal display device having same size pixels of the invention, when the width of the light blocking member is reduced, the aperture ratio of the device may be improved.

An overcoat 250 is disposed on the color filter 230 and the light blocking member 220, but the invention is not limited thereto. In an exemplary embodiment, the overcoat 250 may be omitted.

A common electrode 270 which faces the pixel electrode 191 and receives a common voltage Vcom is disposed on the overcoat 250. The common electrode 270 may be disposed as a substantially unitary plate so as to face a plurality of pixel electrodes 191, for example, all of the pixel electrodes 191, but the invention is not limited thereto.

An alignment layer 21 may be disposed on the common electrode 270.

Two alignment layers 11 and 21 of the lower display panel 100 and the upper display panel 200 may be vertical alignment layers.

The liquid crystal layer 3 interposed between the lower display panel 100 and the upper display panel 200 includes liquid crystal molecules 31 having dielectric anisotropy. The liquid crystal molecules 31 may be aligned so that long axes thereof are substantially vertical to the surfaces of the two display panels 100 and 200 in a state where an electric field is not applied.

The first subpixel electrode 191a of the lower display panel 100 forms the first liquid crystal capacitor Clca together with the common electrode 270 of the upper display panel 200, and with the liquid crystal layer 3 therebetween. The second subpixel electrode 191b forms the second liquid crystal capacitor Clcb together with the common electrode 270, and with the liquid crystal layer 3 therebetween.

The first and second subpixel electrodes 191a and 191b to which the data voltages are applied generate an electric field in the liquid crystal layer 3 together with the common electrode 270 of the upper display panel 200 so as to determine directions of the liquid crystal molecules 31 of the liquid crystal layer 3 between the two electrodes 191 and 270.

According to an exemplary embodiment of the invention described above, the width of the light blocking member within a pixel (e.g., between subpixel electrodes may be approximately 40 μm to about 50 μm, such that an aperture ratio of approximately 60% may be defined. In contrast, when a conventional liquid crystal display device includes the width of the light blocking member of approximately 80 μm or more, the aperture ratio of approximately 51% is defined. Since one or more exemplary embodiment of the liquid crystal display device of the invention has the width of the light blocking member within a pixel as approximately 40 μm to about 50 μm, the aperture ratio thereof may be increased by approximately 16% as compared to that of the conventional liquid crystal display device.

In summary, according to one or more exemplary embodiment of the invention, the third thin film transistor does not include the gate electrode extended from a main portion of the gate line, but instead includes a floating gate electrode which is separated and independent from the gate electrode extended from the main portion of the gate line. Therefore, an area occupied by the switching element having the floating electrode as a terminal thereof without a separate signal line is reduced, and an area occupied by the pixel in which the third thin film transistor is disposed is increased, and thus the aperture ratio of the liquid crystal display device may be improved.

Further, according to a position change of the contact hole overlapping with the subpixel electrode, an area occupied by the thin film transistor of which a terminal thereof is exposed at the contact hole and the like is reduced. Accordingly, a width of the light blocking member overlapping with the thin film transistor area and the contact hole area is reduced and the aperture ratio of the liquid crystal display device may be improved.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A liquid crystal display device, comprising:
   a first substrate for which a single pixel includes:
      a first thin film transistor, a second thin film transistor and a third thin film transistor on the first substrate;
      a pixel electrode including a first subpixel electrode and a second subpixel electrode which are connected to the first thin film transistor and the second thin film transistor, respectively; and
      a divided reference voltage line connected to the third thin film transistor;
   a second substrate facing the first substrate;
   a common electrode on the second substrate; and
   a liquid crystal layer between the pixel electrode and the common electrode, the liquid crystal layer including liquid crystal molecules,
   wherein the third thin film transistor includes:
      an electrically floating gate electrode,
      a source electrode defined by an extended portion of a terminal of the second thin film transistor, and
      a drain electrode defined by an extended portion of the divided reference voltage line.

2. The liquid crystal display device of claim 1, wherein:
   the electrically floating gate electrode and the drain electrode defined by the extended portion of the divided reference voltage line form a first capacitor, and
   the electrically floating gate electrode and the source electrode defined by the extended portion of the terminal of the second thin film transistor form a second capacitor.

3. The liquid crystal display device of claim 1, further comprising:
   a gate line and a data line on the first substrate and insulatively crossing each other,
   wherein the first thin film transistor and the second thin film transistor are connected to the gate line and the data line on the first substrate and insulatively crossing each other.

4. The liquid crystal display device of claim 3, wherein:
   the electrically floating gate electrode of the third thin film transistor is in a same layer as the gate line, the electrically floating gate electrode in the same layer as the gate line being separated from the gate line.

5. The liquid crystal display device of claim 3, wherein:
   the data line and the divided reference voltage line are in a same layer as each other.

6. The liquid crystal display device of claim 3, wherein:
   the data line applies a same voltage to the first thin film transistor and to the second thin film transistor,
   the voltage applied to the second thin film transistor is divided through the third thin film transistor including the electrically floating gate electrode to define a divided reference voltage less than the voltage applied to the second thin film transistor, and the drain electrode defined by the extended portion of the divided reference voltage line receives the divided reference voltage which is less than the voltage applied to the second thin film transistor.

7. The liquid crystal display device of claim 3, wherein:
the single pixel further includes a first liquid crystal capacitor defined therein, and
the first thin film transistor includes:
- a first gate electrode defined by a first extended portion of the gate line,
- a first source electrode defined by a first extended portion of the data line, and
- a first drain electrode in a same layer as the first source electrode, the first drain electrode separated from the first source electrode,
- wherein the first thin film transistor is connected to the first liquid crystal capacitor.

8. The liquid crystal display device of claim 7, wherein:
the single pixel further includes a second liquid crystal capacitor defined therein, and
the second thin film transistor includes:
- a second gate electrode defined by a second extended portion of the gate line of which the first extended portion thereof defines the first gate electrode,
- a second source electrode defined by a second extended portion of the data line of which the first extended portion thereof defines the first source electrode, and
- a second drain electrode in a same layer as the second source electrode, the second drain electrode separated from the second source electrode, and
- wherein the second thin film transistor is connected to the second liquid crystal capacitor.

9. The liquid crystal display device of claim 7, wherein:
each of the first subpixel electrode and the second subpixel electrode includes:
a cross stem, and
a plurality of minute branches extended in an oblique direction from the cross stem.

10. The liquid crystal display device of claim 9, wherein:
the first drain electrode of the first thin film transistor overlaps the cross stem of the first subpixel electrode.

11. The liquid crystal display device of claim 9, wherein:
the first subpixel electrode and the first thin film transistor are connected to each other at a cross point of the cross stem.

12. The liquid crystal display device of claim 3, further comprising:
a light blocking member on the second substrate, the light blocking member overlapping the first to third thin film transistors to have a length in an extending direction of the gate line and a width in a direction perpendicular to the length thereof.

13. The liquid crystal display device of claim 12, wherein:
the width of the light blocking member is approximately 40 micrometers to approximately 70 micrometers.

14. The liquid crystal display device of claim 3, wherein:
each of the first and second thin film transistors is connected to a single gate line and a single data line which insulatively cross each other, and
the second thin film transistor connected to the single gate line and the single data line which insulatively cross each other includes:
- a second gate electrode defined by an extended portion of the single gate line,
- a second source electrode defined by an extended portion of the single data line, and
- a second drain electrode in a same layer as the second source electrode, the second drain electrode separated from the second source electrode, and
- wherein in the second thin film transistor, the second drain electrode thereof defines the terminal of which the extended portion thereof defines the source electrode of the third film transistor.

* * * * *